(12) United States Patent
Ivanov et al.

(10) Patent No.: US 12,483,198 B2
(45) Date of Patent: Nov. 25, 2025

(54) VOLTAGE BUFFER

(71) Applicant: TEXAS INSTRUMENTS INCORPORATED, Dallas, TX (US)

(72) Inventors: Vadim Valerievich Ivanov, Dallas, TX (US); Srinivas Kumar Pulijala, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 515 days.

(21) Appl. No.: 18/090,756

(22) Filed: Dec. 29, 2022

(65) Prior Publication Data
US 2024/0223130 A1 Jul. 4, 2024

(51) Int. Cl.
*H03F 1/08* (2006.01)
*H03F 3/18* (2006.01)
*H03F 3/50* (2006.01)

(52) U.S. Cl.
CPC ............ *H03F 1/086* (2013.01); *H03F 3/505* (2013.01)

(58) Field of Classification Search
CPC .... H03F 1/086; H03F 3/505; H03F 2200/297; H03F 3/303; H03F 3/45475; H03F 1/56; H03K 19/018557; H03K 19/00315

USPC .................................. 330/277, 262–267
See application file for complete search history.

(56) References Cited

U.S. PATENT DOCUMENTS 7,078,973 B2 * 7/2006 Alenin ................. H03F 3/3066
330/263

* cited by examiner

*Primary Examiner* — Hieu P Nguyen
(74) *Attorney, Agent, or Firm* — Mandy Barsilai Fernandez; Frank D. Cimino

(57) ABSTRACT

In an example, a circuit includes a first field-effect transistor (FET) having a gate and first and second terminals. The circuit includes a second FET having a gate and first and second terminals, the second terminals of the first and second FETs coupled together. The circuit includes a first boosted follower coupled to the gate of the first FET and includes a second boosted follower coupled to the gate of the second FET. A third FET is coupled to the first boosted follower and the second voltage terminal and configured to turn off the first boosted follower responsive to a first level of an output voltage. A fourth FET is coupled to the second boosted follower and the first voltage terminal and configured to turn off the second boosted follower responsive to a second level of the output voltage.

20 Claims, 2 Drawing Sheets

VOLTAGE BUFFER

BACKGROUND

An output stage of an amplifier can deliver power to a load. In a class AB amplifier, two output stage transistors drive the load. The output stage should provide a stable output voltage across a wide range of capacitive loads, with acceptably low levels of signal distortion. To provide this stability, the output stage desirably has high input impedance and low output impedance. A high input impedance allows the amplifier to receive input signals from many kinds of source devices while drawing minimal current from the source device, without loading the source device that provides the input signal to the amplifier. A low output impedance allows the amplifier to drive many different kinds of loads without the load reducing the voltage output of the amplifier.

SUMMARY

In an example, a circuit includes a first transistor having a control terminal and first and second terminals, the first terminal coupled to a first voltage terminal. The circuit also includes a second transistor having a control terminal and first and second terminals, the first terminal of the second transistor coupled to a second voltage terminal, the second terminals of the first and second transistors coupled together and to an output terminal. The circuit includes a first boosted follower coupled to the control terminal of the first transistor. The circuit also includes a second boosted follower coupled to the control terminal of the second transistor. The circuit includes a third transistor coupled to the first boosted follower and the second voltage terminal and configured to turn off the first boosted follower if an output voltage at the second terminals of the first and second transistors crosses a first threshold. The circuit also includes a fourth transistor coupled to the second boosted follower and the first voltage terminal and configured to turn off the second boosted follower if the output voltage crosses a second threshold.

In an example, a circuit includes a first field-effect transistor (FET) having a gate and first and second terminals, the first terminal coupled to a first voltage terminal. The circuit also includes a second FET having a gate and first and second terminals, the first terminal of the second FET coupled to a second voltage terminal, the second terminals of the first and second FETs coupled together. The circuit includes a first boosted follower coupled to the gate of the first FET. The circuit also includes a second boosted follower coupled to the gate of the second FET. The circuit includes a third FET coupled to the first boosted follower and the second voltage terminal and configured to turn off the first boosted follower responsive to a first level of an output voltage. The circuit includes a fourth FET coupled to the second boosted follower and the first voltage terminal and configured to turn off the second boosted follower responsive to a second level of the output voltage.

In an example, a circuit includes a first transistor having a control terminal and first and second terminals, the first terminal coupled to a first voltage terminal. The circuit also includes a second transistor having a control terminal and first and second terminals, the first terminal of the second transistor coupled to a second voltage terminal, the second terminals of the first and second transistors coupled together. The circuit includes a gain stage with a first input and a second input, the second input coupled to the second terminals of the first and second transistors. The circuit also includes a third transistor coupled to the second voltage terminal and a fourth transistor coupled to the first voltage terminal. The circuit includes a fifth transistor and a sixth transistor, a source of the fifth transistor coupled to the first transistor, and a gate of the fifth transistor coupled to a gate and a drain of the sixth transistor. The circuit includes a first current mirror coupled to a source of the sixth transistor. The circuit also includes a seventh transistor and an eighth transistor, a source of the seventh transistor coupled to the second transistor, and a gate of the seventh transistor coupled to a gate and a drain of the eighth transistor. The circuit includes a second current mirror coupled to a source of the eighth transistor. In the circuit, the third transistor is configured to turn off the fifth transistor and the sixth transistor if the output voltage at the second terminals of the first and second transistors crosses a first threshold. The fourth transistor is configured to turn off the seventh transistor and the eighth transistor if the output voltage crosses a second threshold.

BRIEF DESCRIPTION OF THE DRAWINGS

The same reference numbers or other reference designators are used in the drawings to designate the same or similar (functionally and/or structurally) features.

DETAILED DESCRIPTION

Figure 1:
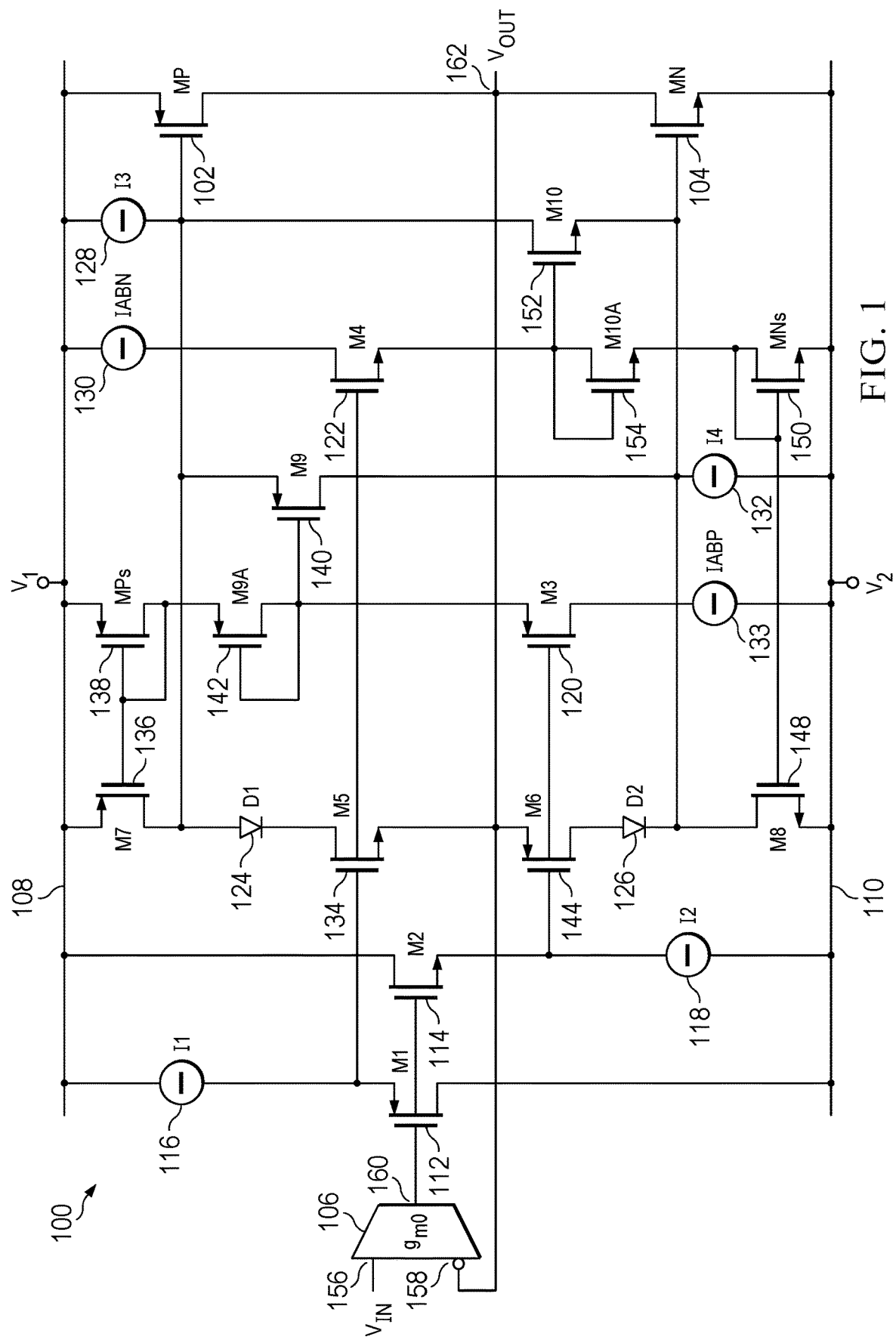
FIG. 1 is a circuit diagram of an example voltage buffer.

Voltage buffers at an output stage of an amplifier may have a variety of configurations. Some voltage buffers provide low output impedance, which improves stability of the output signal of the amplifier if the amplifier drives a large capacitive load. Some output stages, like the Monticelli class AB output stage, provide high output impedance. Frequency compensation of amplifiers with high output impedance for large load capacitances may be complicated and may require high currents during operation of the amplifier. Buffers with high output impedance, like the Monticelli output stage, have varying gain and may introduce up to 20 dB (decibels) of additional distortions in a processed signal. Some output stages that provide low output impedance and high stability with capacitive loads do not produce a rail-to-rail output voltage range, where the output voltage ranges from the positive voltage rail (maximum supply voltage) to the negative voltage rail (minimum supply voltage). Instead, the output voltage falls short of one or both rails in those output stages. Other output stages that may produce a rail-to-rail output voltage do not have low output impedance and are difficult to compensate when driving a capacitive load.

In examples herein, a voltage buffer is described that produces low output impedance, high stability with a capacitive load, and has a rail-to-rail output voltage. The voltage buffer described herein may be a class AB amplifier. A class AB amplifier receives an input signal and amplifies the input signal to produce an output signal. For a voltage buffer that acts as an amplifier, the output signal should respond quickly to changes to the input signal. For a voltage buffer with a low output impedance, a change in the output current produces a smaller voltage change at the output than a voltage buffer with a high output impedance. Therefore, the voltage buffer with a low output impedance is less affected by the current drawn by the load. A low output impedance may also provide more current to the load than a high output impedance.

The described voltage buffer has two output transistors, e.g., a high-side transistor and a low-side transistor. In class AB operation, the two output transistors are biased to reconstruct and amplify the full input waveform with each output transistor conducting for more than half of the full cycle of the input signal. Also, in the described voltage buffer, each output transistor is coupled to transistors having a boosted follower configuration. In a boosted follower configuration, a first transistor has its gate coupled to its drain. A second transistor has its gate coupled to the gate and drain of the first transistor. The gate of the second transistor receives an input signal and the source of the second transistor produces an output signal. The boosted follower has a high input impedance and a low output impedance. The boosted follower produces unity voltage gain, but produces a high current gain. Each of the boosted followers coupled to the output transistors are coupled to current sources. Each of two additional transistors may disable a selected one of the boosted followers responsive to the output voltage approaching one of the voltage rails. By disabling a portion of the circuitry in the voltage buffer, the output voltage is allowed to fully reach the voltages at both the positive rail and the negative rail. The described examples provide a stable output voltage across a wide range of capacitive loads.

FIG. 1 is a circuit diagram of an example voltage buffer 100. The voltage buffer 100 is an output stage for an amplifier in one example. Voltage buffer 100 includes a high-side transistor MP 102 and a low-side transistor MN 104. MP 102 is a p-channel transistor, and MN 104 is an n-channel transistor in one example. In one example, MP 102 and MN 104 are similar size transistors. Each of the other transistors in voltage buffer 100 may also be similar in size to one another, with these transistors having similar gate to source threshold voltages for turning on and off the transistors. Voltage buffer 100 also includes a gain stage 106, a first voltage rail (voltage terminal) 108 (at which a voltage V1 is provided), and a second voltage rail (voltage terminal) 110 (at which a voltage V2 is provided). Gain stage 106 is a transconductance amplifier having a transconductance $g_{m0}$, in one example. A transconductance amplifier produces an output current proportional to an input voltage, and provides current gain to the input signal $V_{IN}$ in one example. The gain stage 106 is designed to provide current gain for a given application, if additional current is useful for driving the transistors in voltage buffer 100. The amplifier may be designed to have a specific transconductance $g_{m0}$ to provide the appropriate current gain. In an example, a first voltage supply (not shown) is coupled to voltage rail 108 and provides the voltage V1, and a second voltage supply (not shown) is coupled to voltage rail 110 and provides the voltage V2. In one example, voltage V1 is 2.5 volts, and voltage V2 is −2.5 volts. Other voltage values may be useful in other examples.

Voltage buffer 100 also includes transistor M1 112 (e.g., p-channel transistor), transistor M2 114 (e.g., n-channel transistor), current source I1 116, current source I2 118, and disable transistors M3 120 (e.g., p-channel transistor) and M4 122 (e.g., n-channel transistor). Disable transistors disable portions of voltage buffer 100 to achieve rail-to-rail operation as described herein.

Voltage buffer 100 includes diode D1 124, diode D2 126, current source I3 128, current source IABN 130, current source I4 132, and current source IABP 133. Voltage buffer 100 also includes transistors M5 134 (e.g., n-channel field-effect transistor (FET)), M7 136 (e.g., p-channel transistor), MPs 138 (e.g., p-channel transistor), M9 140 (e.g., p-channel transistor), and M9A 142 (e.g., p-channel transistor). Voltage buffer 100 also includes transistors M6 144 (e.g., p-channel transistor), M8 148 (e.g., n-channel transistor), MNs 150 (e.g., n-channel transistor), M10 152 (e.g., n-channel transistor), and M10A 154 (e.g., n-channel transistor). Gain stage 106 has a first input 156, a second input 158, and an output 160. First input 156 is coupled to a source that provides an input signal $V_{IN}$. The source that provides input signal $V_{IN}$ may be another stage of the circuit, or may be a source device that provides an input signal for amplification (such as a microphone, analog-to-digital converter, etc.). An output voltage $V_{OUT}$ for voltage buffer 100 is provided at node (output or output terminal) 162. Output voltage $V_{OUT}$ may drive a load (such as a speaker) or may be provided to additional circuitry coupled to voltage buffer 100.

In this example, MP 102 has a source coupled to first voltage rail 108, a drain coupled to node 162 and the drain of MN 104, and a gate coupled to current source I3 128, a source of M9 140, a drain of M7 136, an anode of D1 124, and a drain of M10 152. MN 104 has a source coupled to second voltage rail 110, a drain coupled to node 162 and the drain of MP 102, and a gate coupled to current source I4 132, a drain of M8 148, a source of M10 152, a cathode of D2 126, and a drain of M9 140. M1 112 has a source coupled to current source I1 116 and the gate of M5 134, a drain coupled to second voltage rail 110, and a gate coupled to output 160 of gain stage 106. M2 114 has a source coupled to current source I2 118 and the gate of M6 144, a drain coupled to first voltage rail 108, and a gate coupled to the gate of M1 112.

Disable transistors M3 120 and M4 122 can disable portions of the circuitry in voltage buffer 100 as described below. M3 120 has a source coupled to the drain of M9A 142 and the gates of M9 140 and M9A 142, a drain coupled to current source IABP 133, and a gate coupled to current source I2 118. M4 122 has a source coupled to the drain of M10A 154 and the gates of M10 152 and M10A 154, a drain coupled to current source IABN 130, and a gate coupled to current source I1 116 and the source of M1 112.

Transistor M5 134 has a source coupled to the source of transistor M6 144, the node 162, and the second input 158, a drain coupled to the cathode of diode D1 124, and a gate coupled to current source I1 116. Transistor M6 144 has a drain coupled to the anode of diode D2 126 and a gate coupled to current source I2 118. Transistors M7 136 and MPs 138 are coupled together as a current mirror. Transistors M7 136 and MPs 138 have sources coupled to first voltage rail 108 and gates coupled to one another and to the drain of MPs 138. M7 136 has a drain coupled to the anode of diode D1 124 and the gate of MP 102. MPs 138 has a drain coupled to a source of transistor M9A 142. The current mirror of transistors M7 136 and MPs 138 forms a current source for the boosted follower of transistors M9 140 and M9A 142.

Transistors M9 140 and M9A 142 are connected in a boosted follower configuration, and coupled to the current mirror of M7 136 and MPs 138. The boosted follower has a first transistor (e.g., M9A 142) with a drain coupled to its gate. The boosted follower has a second transistor (e.g., M9 140) with its gate coupled to the gate and drain of the first transistor. The gate of the second transistor receives an input signal and the source of the second transistor produces an output signal. The boosted follower has a high input impedance at the gate of the second transistor and a low output impedance at the source of the second transistor. The boosted follower produces unity voltage gain, but produces a high current gain. The output signal of the boosted follower at the source of the second transistor is provided to the gate of one of the output transistors (MP 102 in this example). The high current in this example is provided to the gate of the output transistor to drive the output transistor and also provide a low output impedance at the gate of the output transistor. M9 140 has a source coupled to the gate of MP 102 and to the anode of D1 124 and the drain of M7 136, a drain coupled to current source I4 132, and a gate coupled to the drain and gate of M9A 142 and the source of M3 120. M9A 142 has a source coupled to the drain of MPs 138 and a gate and drain coupled to the gate of M9 140 and the source of M3 120.

As described below, M3 120 can disable or turn off M9 140 and M9A 142 as the output voltage $V_{OUT}$ at node 162 approaches the voltage V1 at first voltage rail 108. M9 140 and M9A 142 are turned off by reducing the gate to source voltages of each transistor below the threshold voltage. Turning off M9 140 and M9A 142 allows the output voltage $V_{OUT}$ to reach V1, which provides rail-to-rail operation. As described below, M4 122 enables $V_{OUT}$ at node 162 to reach voltage V2 at second voltage rail 110.

Transistors M8 148 and MNs 150 are also coupled together as a current mirror. Transistors M8 148 and MNs 150 have sources coupled to second voltage rail 110 and gates coupled to one another and to the drain of MNs 150. M8 148 has a drain coupled to the cathode of diode D2 126, the current source I4 132, the drain of M9 140, and the gate of MN 104. MNs 150 has a drain coupled to a source of transistor M10A 154. The current mirror of transistors M8 148 and MNs 150 forms a current source for the boosted follower of transistors M10 152 and M10A 154.

Transistors M10 152 and M10A 154 are connected in a boosted follower configuration, and coupled to the current mirror of M8 148 and MNs 150. M10 152 has a source coupled to the gate of MN 104, a drain coupled to current source I3 128, and a gate coupled to the drain and gate of M10A 154. M10A 154 has a source coupled to the drain of MNs 150 and the gate and drain coupled to the gate of M10 152 and the source of M4 122. As described below, M4 122 can disable or turn off M10 152 and M10A 154 as the output voltage $V_{OUT}$ at node 162 approaches the voltage V2 at second voltage rail 110. M10 152 and M10A 154 are turned off by reducing the gate to source voltages of each transistor below the threshold voltage. Turning off M10 152 and M10A 154 allows the output voltage $V_{OUT}$ to reach V2, which allows for rail-to-rail operation.

Voltage buffer 100 provides a rail-to-rail output voltage at node 162. More particularly, output voltage $V_{OUT}$ can reach both V1 and V2 in this example, which are the voltages at the voltage rails. In voltage buffer 100, a top portion of the circuit coupled to MP 102 includes components M5 134, M7 136, MPs 138, M9 140, and M9A 142. Current sources I4 132 and IABP 133 provide currents to these components. M3 120 is coupled to these components and disables or turns off M9 140 and M9A 142 as the output voltage $V_{OUT}$ at node 162 approaches the voltage V1 at first voltage rail 108.

In voltage buffer 100, a bottom portion of the circuit coupled to MN 104 includes components M6 144, M8 148, MNs 150, M10 152, and M10A 154. Current sources I3 128 and IABN 130 provide current to these components. M4 122 is coupled to these components and disables or turns off M10 152 and M10A 154 as the output voltage $V_{OUT}$ at node 162 approaches the voltage V2 at second voltage rail 110.

Voltage buffer 100 has three modes of operation. The first mode is when $V_{OUT}$ is near the midpoint between V1 and V2. In this example, a voltage near the midpoint is within one to two gate to source threshold voltages for the transistors in voltage buffer 100 away from the midpoint. The second mode is when $V_{OUT}$ is near the positive rail. $V_{OUT}$ is near the positive rail in one example when $V_{OUT}$ is less than a gate to source threshold voltage of the transistors in voltage buffer 100 away from the positive rail. The third mode is when $V_{OUT}$ is near the negative rail. $V_{OUT}$ is near the negative rail in one example when $V_{OUT}$ is less than a gate to source threshold voltage of the transistors in voltage buffer 100 away from the negative rail.

In operation, first input 156 receives an input signal $V_{IN}$. Voltage buffer 100 amplifies the input signal $V_{IN}$, producing the output signal $V_{OUT}$. If $V_{OUT}$ is near the midpoint between V1 and V2, the transistors M5 134, M7 136, MPs 138, M9 140, M9A 142, and M4 122 are on. Also, the transistors M6 144, M8 148, MNs 150, M10 152, M10A 154, and M3 120 are on. Both the top half of voltage buffer 100 (e.g., components coupled to the gate of MP 102) and the bottom half of voltage buffer 100 (e.g., components coupled to the gate of MN 104) are on and operational in the first mode of operation.

In the second mode, as $V_{OUT}$ nears the positive rail voltage V1, $V_{OUT}$ cannot reach all the way to V1 if all the transistors in the top half of voltage buffer 100 are on. $V_{OUT}$ is approximately one gate to source threshold voltage away from the positive rail if all the transistors in the top half of voltage buffer 100 are on. As an example, if M5 134 has a gate voltage at the positive rail voltage V1, the voltage at the source of M5 134 (e.g., $V_{OUT}$) would be less than V1 by the gate-to-source voltage ($V_{GS}$) of M5 134. Therefore, $V_{OUT}$ would fall short of V1 by an amount approximately equal to the $V_{GS}$ of M5 134.

Likewise, in the third mode, as $V_{OUT}$ nears the negative rail voltage V2, $V_{OUT}$ cannot reach all the way to V2 if all the transistors in the bottom half of voltage buffer 100 are on. $V_{OUT}$ is approximately one gate to source threshold voltage away from the negative rail if all the transistors in the bottom half of voltage buffer 100 are on. For example, if M6 144 has a gate voltage at the negative rail voltage V2, the voltage at the source of M6 144 (e.g., $V_{OUT}$) would be higher than V2 by the $V_{GS}$ of M6 144. Therefore, $V_{OUT}$ would remain above V2 by an amount approximately equal to the $V_{GS}$ of M6 144.

In an example operation, an input signal $V_{IN}$ is received by voltage buffer 100. Voltage buffer 100 amplifies $V_{IN}$ and produces an output signal $V_{OUT}$ via Class AB operation. If the input signal is in the top half of the input signal range, MP 102 is on and amplifies the input signal $V_{IN}$ to produce an amplified output signal $V_{OUT}$ at node 162. Because voltage buffer 100 is a Class AB amplifier, MN 104 is also on for part of the top half of the input signal range. If the input signal is in the bottom half of the input signal range, MN 104 is on and amplifies the input signal $V_{IN}$ to produce an amplified output signal $V_{OUT}$ at node 162. Because voltage buffer 100 is a Class AB amplifier, MP 102 is also on for part of the bottom half of the input signal range. Therefore, in the middle portion of the input signal range, both MP 102 and MN 104 are conducting. The other transistors, diodes, and current sources in voltage buffer 100 bias the output transistors MP 102 and MN 104 and transfer the input signal $V_{IN}$ to the gates of the output transistors, where the input signal $V_{IN}$ is amplified to provide $V_{OUT}$.

Voltage buffer 100 achieves a rail-to-rail output voltage $V_{OUT}$. To achieve a rail-to-rail $V_{OUT}$, disable transistors M3 120 and M4 122 disable portions of the circuitry in voltage buffer 100 as $V_{OUT}$ nears one of the voltage rails in examples herein. By disabling the selected circuitry at the appropriate time, $V_{OUT}$ can reach both voltages V1 and V2. The operations of the three modes are described below.

In the first mode of operation, if output voltage $V_{OUT}$ at node 162 is near the midpoint between V1 and V2 as described above, output voltage $V_{OUT}$ is equal to the gate voltage at M1 112 and M2 114 (subject to any process variations of the transistors). The voltage at the source of M2 114 is equal to the voltage at the gate of M6 144. The source of M6 144 is coupled to node 162. The voltage at the gate of M6 144 is the gate voltage of M2 114 minus the $V_{GS}$ of M2 114. The voltage at the source of M6 144 is the gate voltage of M6 144 plus the $V_{GS}$ of M6 144. Therefore, if M2 114 and M6 144 are equal in size, the $V_{GS}$ of M2 114 is approximately equal to the $V_{GS}$ of M6 144. The drop in voltage from gate to source of M2 114 is approximately equal to the rise in voltage from gate to source of M6 144, so the gate voltage of M2 114 is approximately equal to the source voltage of M6 144, which is coupled to node 162 (e.g., $V_{OUT}$).

Also, during the first mode of operation, the current through M6 144 equals the current through M8 148, and the current through M5 134 equals the current through M7 136, as all of these transistors are on. Current source IABN 130 provides the current flowing through M6 144 and M8 148, and current source IABP 133 provides the current flowing through M5 134 and M7 136. For IABN 130, transistors M4 122 and M10A 154 are on during this mode. Therefore the current from current source IABN 130 flows through M4 122, M10A 154, and is then mirrored through the current mirror of MNs 150 and M8 148 (which is also operational during the first mode of operation). The current mirror of MNs 150 and M8 148 is operational because the sources of MNs 150 and M8 148 are tied to a lower voltage (e.g., V2) than the gates of these transistors, which are tied to the drain of MNs 150. The current provided by the current mirror of MNs 150 and M8 148 then flows through M6 144. Likewise, for IABP 133, transistors M3 120 and M9A 142 are on during this mode. Therefore the current from current source IABP 133 is mirrored through the current mirror of MPs 138 and M7 136 (which is also operational during the first mode of operation), and flows through M5 134. The current mirror of MPs 138 and M7 136 is operational because the sources of MPs 138 and M7 136 are tied to a higher voltage (e.g., V1) than the gates of these transistors, which are tied to the drain of MPs 138.

For the bottom portion of voltage buffer 100, a feedback loop of MN 104 and M6 144 has relatively large gain and provides linearity, in which the output signal varies linearly with the input signal. As an example, if output current changes due to a change in the load, the gate voltages of MP 102 and MN 104 also changes. A change in the gate voltage of MP 102 or MN 104 changes the open loop gain of the amplifier and may cause non-linear distortions. In this example, the source of M5 134 and the source of M6 144 are coupled to node 162, which provides $V_{OUT}$. Node 162 is coupled to the drain of MN 104, which is coupled to the source of M6 144. The gate of MN 104 is coupled to the drain of M6 144 through diode D2 126. Therefore, MN 104 has a drain coupled to the source of M6 144 and a gate coupled to the drain of M6 144. This configuration creates a feedback loop between MN 104 and M6 144. M6 144 has a low output impedance at its source, and the feedback loop reduces the output impedance even more. If the voltage at the gate of MN 104 varies, that change is not translated to the input of voltage buffer 100 due to the low output impedance of MN 104.

For the top portion of voltage buffer 100, a feedback loop of MP 102 and M5 134 operates similarly to the feedback loop between MN 104 and M6 144. Therefore, these two feedback loops provide a low output impedance for voltage buffer 100. A low output impedance provides stability for the output voltage of the buffer if the load capacitance changes, and improves on the non-linear distortions caused by a change in the output current.

In the second mode of operation, as the output voltage $V_{OUT}$ at node 162 approaches voltage V1 at first voltage rail 108 (e.g., as $V_{OUT}$ comes within a gate to source threshold voltage of the first voltage rail 108), the gate voltage at M2 114 rises, which also causes the gate voltages at M6 144 and M3 120 to rise. As the gate of M3 120 rises, M3 120 turns off and stops current from current source IABP 133 from flowing through MPs 138. The gate voltage at M9 140 rises, because M3 120 is no longer on to pull the gate voltage down. M9 140 therefore turns off, which turns off the current mirror of MPs 138 and M7 136, and other components in the top portion of the circuit (components M5 134 and M9A 142) turn off as well. This portion of voltage buffer 100 is turned off by M3 120 if the output voltage $V_{OUT}$ crosses (e.g., rises above) a first predetermined threshold that is near the voltage V1. In another example, this portion of voltage buffer 100 (including the boosted follower of M9 140 and M9A 142) is turned off responsive to a first level of an output voltage $V_{OUT}$. The first predetermined threshold (e.g., the first level of $V_{OUT}$) may be a voltage value within one gate to source threshold voltage of V1. As described above, if M5 134 is on, $V_{OUT}$ cannot rise all the way to V1. Instead, $V_{OUT}$ may fall short of V1 by a gate to source threshold voltage. With the top portion of the circuit off, and the bottom portion of the circuit on, the output voltage $V_{OUT}$ at node 162 can rise to V1 at first voltage rail 108 in the second mode of operation.

Conversely, in the third mode of operation, as the output voltage $V_{OUT}$ at node 162 approaches voltage V2 at second voltage rail 110, the gate voltage at M1 112 falls, which also causes the gate voltages at M5 134 and M4 122 to fall. As the gate voltage of M4 122 falls, M4 122 turns off and stops current from current source IABN 130 from flowing through MNs 150. The gate voltage at M10 152 falls, because M4 122 is no longer on to pull the gate voltage up. M10 152 therefore turns off, and the bottom portion of the circuit (components M6 144, M8 148, MNs 150, M10 152, and M10A 154) turns off as well. This portion of voltage buffer 100 is turned off by M4 122 if the output voltage $V_{OUT}$ crosses (e.g., falls below) a second predetermined threshold that is near the voltage V2. In another example, this portion of voltage buffer 100 (including the boosted follower of M10 152 and M10A 154) is turned off responsive to a second level of an output voltage $V_{OUT}$. The second predetermined threshold (e.g., the second level of $V_{OUT}$) may be a voltage value within one gate to source threshold voltage of V2. With the bottom portion of the circuit off, and with the top portion of the circuit on, the output voltage $V_{OUT}$ at node 162 can drop to V2 at second voltage rail 110 in the third mode of operation.

Therefore, in this example, disable transistors M3 120 and M4 122 disable certain portions of voltage buffer 100 as the output voltage $V_{OUT}$ approaches a respective voltage rail. M3 120 turns off boosted follower M9 140 and M9A 142 as output voltage $V_{OUT}$ approaches V1 at the first voltage rail 108 (e.g., when $V_{OUT}$ gets within a gate to source threshold voltage of V1). M4 122 turns off boosted follower M10 152 and M10A 154 as output voltage $V_{OUT}$ approaches V2 at the second voltage rail 110 (e.g., when $V_{OUT}$ gets within a gate to source threshold voltage of V2). Disabling the boosted follower circuitry at the appropriate time allows the output voltage $V_{OUT}$ to reach the voltages V1 and V2 provided by the voltage rails. If output voltage $V_{OUT}$ is near the middle of the voltage range between V1 and V2, both boosted followers are operational, as well as both MP 102 and MN 104. The other components in voltage buffer 100 provide bias voltages and currents to MP 102 and MN 104, and to help transfer and amplify an input voltage $V_{IN}$ at first input 156 to an output at node 162. Diodes D1 124 and D2 126 prevent current backflow as the output voltage $V_{OUT}$ approaches the voltage rails.

In one example, M3 120 is a first transistor coupled to a first boosted follower. The first boosted follower includes M9 140 and M9A 142. M4 122 is a second transistor coupled to a second boosted follower. The second boosted follower includes M10 152 and M10A 154. As shown in voltage buffer 100, the first boosted follower is coupled to a gate of MP 102. The first boosted follower is also coupled to a gate of MN 104 (e.g., a drain of M9 140 is coupled to the gate of MN 104). The second boosted follower is also coupled to a gate of MP 102 (e.g., a drain of M10 152 is coupled to the gate of MP 102). In this example, the current mirror of M7 136 and MPs 138 is a first current source coupled to the first boosted follower. The current mirror of M8 148 and MNs 150 is a second current source coupled to the second boosted follower.

In the first boosted follower, M9 140 may be a third transistor and M9A 142 may be a fourth transistor. A source of M9 140 is coupled to MP 102, a gate of M9 140 is coupled to a gate and drain of M9A 142, and a source of M9A 142 is coupled to a first current source (e.g., the current mirror of M7 136 and MPs 138). In the second boosted follower, M10 152 may be a fifth transistor and M10A 154 may be a sixth transistor. A source of M10 152 is coupled to MN 104, a gate of M10 152 is coupled to a gate and drain of M10A 154, and a source of M10A 154 is coupled to a second current source (e.g., the current mirror of M8 148 and MNs 150).

M3 120 has a gate coupled to a current source I2 118 and a drain coupled to a current source IABP 133. M4 122 has a gate coupled to a current source I1 116 and a drain coupled to a current source IABN 130. Diode D1 124 may be a first diode, and D1 124 is coupled to M5 134, the gate of MP 102, the drain of M7 136, and the source of M9 140. Diode D2 126 may be a second diode, and D2 126 is coupled to M6 144, the gate of MN 104, the drain of M8 148, and source of M10 152.

The structure of voltage buffer 100 in FIG. 1 is one example of a boosted follower configuration for providing rail-to-rail output and low output impedance. Other configurations may be useful in other examples, while remaining within the scope of this disclosure. Transistors shown as p-channel or n-channel transistors in voltage buffer 100 may be other types of transistors in other examples. Components such as current sources and current mirrors may have different configurations in other examples.

Figure 2:
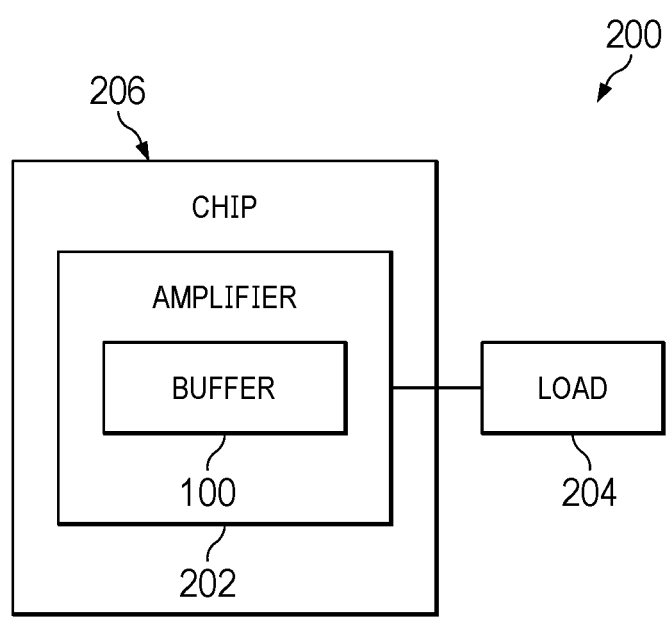
FIG. 2 is a block diagram of an example integrated circuit including a voltage buffer.

FIG. 2 is a block diagram of an example system 200 with a voltage buffer 100 with rail-to-rail output and low output impedance. System 200 includes a load 204 and a chip/integrated circuit 206 (referred to herein as chip 206). Chip 206 includes an amplifier 202. In this example, voltage buffer 100 as described above is a component of amplifier 202. Amplifier 202 may be any suitable type of amplifier in this example, such as a Class AB amplifier as described herein. Load 204 is any load driven by amplifier 202, such as a speaker or the pixels of a touch screen. Chip 206 may be a singulated semiconductor substrate (e.g., a semiconductor chip), mounted on a printed circuit board (PCB), included within a package, or included within an electronic device and includes voltage buffer 100. In other examples, chip 206 may include a comparator, an analog-to-digital converter, a buffer, a driver, a voltage reference, a low-dropout (LDO) regulator, an operational amplifier with low total harmonic distortion, or any other integrated circuit(s) that includes voltage buffer 100. Voltage buffer 100 operates as described above to produce a low output impedance, high stability with a capacitive load, and a rail-to-rail output voltage.

In examples herein, a voltage buffer 100 is described that produces low output impedance, high stability with a capacitive load, and a rail-to-rail output voltage. Disable transistors selectively disable boosted followers and other circuitry in voltage buffer 100 based on the output voltage $V_{OUT}$ approaching one of the voltage rails. By disabling a portion of the circuitry in the voltage buffer, the output voltage $V_{OUT}$ may fully reach the voltages at both the positive rail (e.g., V1) and the negative rail (e.g., V2). The described examples provide stability and low total harmonic distortion across the full range of output voltages.

In this description, the term "couple" may cover connections, communications or signal paths that enable a functional relationship consistent with this description. For example, if device A provides a signal to control device B to perform an action, then: (a) in a first example, device A is directly connected to device B; or (b) in a second example, device A is coupled to device B through intervening component C if intervening component C does not alter the functional relationship between device A and device B, so device B is controlled by device A via the control signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be coupled to at least some of the passive elements and/or the sources to form the described structure either at a time of manufacture or after a time of manufacture, for example, by an end-user and/or a third-party.

While certain components may be described herein as being of a particular process technology, these components may be exchanged for components of other process technologies. Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While the use of particular transistors are described herein, other transistors (or equivalent devices) may be used instead with little or no change to the remaining circuitry. For example, a metal-oxide-silicon field-effect transistor ("MOSFET") (such as an n-channel MOSFET, nMOSFET, or a p-channel MOSFET, pMOSFET), a bipolar junction transistor (BJT—e.g., NPN or PNP), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other type of device structure transistors. Furthermore, the devices may be implemented in/over a silicon substrate (Si), a silicon carbide substrate (SiC), a gallium nitride substrate (GaN) or a gallium arsenide substrate (GaAs). In general, herein, a transistor has a control input/control terminal (e.g., a gate, base) and two additional terminals (e.g., source/drain, collector/emitter).

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter. Modifications are possible in the described examples, and other examples are possible within the scope of the claims.

What is claimed is:

1. A circuit comprising:
a first transistor having a control terminal and first and second terminals, the first terminal coupled to a first voltage terminal;
a second transistor having a control terminal and first and second terminals, the first terminal of the second transistor coupled to a second voltage terminal, the second terminals of the first and second transistors coupled together and to an output terminal;
a first boosted follower coupled to the control terminal of the first transistor;
a second boosted follower coupled to the control terminal of the second transistor;
a third transistor coupled to the first boosted follower and the second voltage terminal and configured to turn off the first boosted follower if an output voltage at the second terminals of the first and second transistors crosses a first threshold; and
a fourth transistor coupled to the second boosted follower and the first voltage terminal and configured to turn off the second boosted follower if the output voltage crosses a second threshold.

2. The circuit of claim 1, further comprising:
a first current source coupled to the first boosted follower; and
a second current source coupled to the second boosted follower.

3. The circuit of claim 2, wherein the first current source and the second current source are current mirrors.

4. The circuit of claim 1, wherein the first boosted follower includes a fifth transistor and a sixth transistor, wherein:
a source of the fifth transistor is coupled to the first transistor;
a gate of the fifth transistor is coupled to a gate and a drain of the sixth transistor; and
a source of the sixth transistor is coupled to a first current source.

5. The circuit of claim 1, wherein the second boosted follower includes a fifth transistor and a sixth transistor, wherein:
a source of the fifth transistor is coupled to the second transistor;
a gate of the fifth transistor is coupled to a gate and a drain of the sixth transistor; and
a source of the sixth transistor is coupled to a second current source.

6. The circuit of claim 1, wherein the third transistor has a source coupled to the first boosted follower, a drain coupled to a first current source, and a gate coupled to a second current source.

7. The circuit of claim 6, wherein the fourth transistor has a source coupled to the second boosted follower, a drain coupled to a third current source, and a gate coupled to a fourth current source.

8. The circuit of claim 1, wherein the control terminal of the first transistor is coupled to the second boosted follower, and the control terminal of the second transistor is coupled to the first boosted follower.

9. The circuit of claim 1, wherein the control terminal of the first transistor is coupled to a diode.

10. The circuit of claim 1, wherein the control terminal of the second transistor is coupled to a diode.

11. The circuit of claim 1, wherein a drain of the second transistor is coupled to a drain of the first transistor, and the circuit is configured to provide the output voltage at the drain of the first transistor and the drain of the second transistor.

12. The circuit of claim 1, wherein the third transistor is configured to turn off the first boosted follower if the output voltage crosses above the first threshold, and the fourth transistor is configured to turn off the second boosted follower if the output voltage crosses below the second threshold.

13. A circuit, comprising:
a first field-effect transistor (FET) having a gate and first and second terminals, the first terminal coupled to a first voltage terminal;
a second FET having a gate and first and second terminals, the first terminal of the second FET coupled to a second voltage terminal, the second terminals of the first and second FETs coupled together;

a first boosted follower coupled to the gate of the first FET;

a second boosted follower coupled to the gate of the second FET;

a third FET coupled to the first boosted follower and the second voltage terminal and configured to turn off the first boosted follower responsive to a first level of an output voltage; and a fourth FET coupled to the second boosted follower and the first voltage terminal and configured to turn off the second boosted follower responsive to a second level of the output voltage.

14. The circuit of claim 13, wherein the first boosted follower includes a fifth transistor and a sixth transistor, a source of the fifth transistor coupled to the first FET, and a gate of the fifth transistor coupled to a gate and a drain of the sixth transistor.

15. The circuit of claim 14, wherein the second boosted follower includes a seventh transistor and an eighth transistor, a source of the seventh transistor coupled to the second FET, and a gate of the seventh transistor coupled to a gate and a drain of the eighth transistor.

16. The circuit of claim 15, wherein a first terminal of the third FET is coupled to the gate of the fifth transistor and the gate of the sixth transistor.

17. The circuit of claim 15, wherein a first terminal of the fourth FET is coupled to the gate of the seventh transistor and the gate of the eighth transistor.

18. The circuit of claim 15, wherein a source of the sixth transistor is coupled to a first current source, and a source of the eighth transistor is coupled to a second current source.

19. The circuit of claim 18, wherein the first current source and the second current source are current mirrors.

20. A circuit, comprising:

a first transistor having a control terminal and first and second terminals, the first terminal coupled to a first voltage terminal;

a second transistor having a control terminal and first and second terminals, the first terminal of the second transistor coupled to a second voltage terminal, the second terminals of the first and second transistors coupled together;

a gain stage with a first input and a second input, the second input coupled to the second terminals of the first and second transistors;

a third transistor coupled to the second voltage terminal;

a fourth transistor coupled to the first voltage terminal;

a fifth transistor and a sixth transistor, a source of the fifth transistor coupled to the first transistor, and a gate of the fifth transistor coupled to a gate and a drain of the sixth transistor;

a first current mirror coupled to a source of the sixth transistor;

a seventh transistor and an eighth transistor, a source of the seventh transistor coupled to the second transistor, and a gate of the seventh transistor coupled to a gate and a drain of the eighth transistor;

a second current mirror coupled to a source of the eighth transistor;

wherein the third transistor is configured to turn off the fifth transistor and the sixth transistor if an output voltage at the second terminals of the first and second transistors crosses a first threshold; and wherein the fourth transistor is configured to turn off the seventh transistor and the eighth transistor if the output voltage crosses a second threshold.

* * * * *